United States Patent
Boemmel et al.

[11] Patent Number: 6,111,412
[45] Date of Patent: Aug. 29, 2000

[54] GRADIENT COIL ASSEMBLY AND METHOD OF PRODUCTION OF SAME

[75] Inventors: Franz Boemmel, Erlangen; Johann Schuster, Oberasbach; Arthur Kaindl, Erlangen, all of Germany

[73] Assignee: Siemens Aktiengesellschaft, Munich, Germany

[21] Appl. No.: 09/083,125

[22] Filed: May 22, 1998

[30] Foreign Application Priority Data

May 26, 1997 [DE] Germany .......................... 197 21 985

[51] Int. Cl.$^7$ ...................................................... G01V 3/00
[52] U.S. Cl. ............................................................ 324/318
[58] Field of Search ................................... 324/318, 322, 324/314, 307, 309

[56] References Cited

U.S. PATENT DOCUMENTS 5,570,021  10/1996  Dachniwskyj et al. ................. 324/318
5,886,548   3/1999  Doty et al. ............................. 324/318

FOREIGN PATENT DOCUMENTS 34 04 457   8/1985  Germany .
40 17 260  12/1990  Germany .
41 41 514   4/1997  Germany .

*Primary Examiner*—Louis Arana
*Attorney, Agent, or Firm*—Hill & Simpson

[57] ABSTRACT

A gradient coil assembly for an NMR tomography apparatus has at least one gradient coil and at least one cooling structure, the cooling structure including at least one flexible cooling conduit for a cooling medium, this conduit being arranged on a flexible carrier. In a method for producing such a gradient coil assembly, a gradient coil and a cooling structure are flexibly attached to a flexible carrier, with the cooling structure being in thermally conducting contact with the gradient coil.

16 Claims, 1 Drawing Sheet

GRADIENT COIL ASSEMBLY AND METHOD OF PRODUCTION OF SAME

BACKGROUND OF THE INVENTION

1. Field of the Invention

The present invention is directed to a gradient coil assembly for an NMR tomography apparatus, the assembly being of the type having at least one gradient coil and one cooling structure, as well as to a method for producing such a gradient coil assembly.

2. Description of the Prior Art

In the operation of an NMR tomography apparatus, for image creation it is necessary to superimpose at least one magnetic field gradient onto a basic magnetic field. This occurs by means of a gradient coil assembly arranged in the basic field. The gradient coil arrangement typically includes a number of coils in order to create three magnetic field gradients residing perpendicularly relative to one another. In the actively shielded gradient coils frequently used today, in addition to the primary coils which create the useful field, secondary coils must be present which prevent the creation of eddy currents in metallic parts surrounding the gradient coil. These secondary coils are arranged concentrically about the primary coils and are at a distance therefrom. Typically, each gradient coil is permeated by a pulse-like current on the order of magnitude of about 300 A. Due to the ohmic resistance of the coil, a considerable amount of energy is converted into heat.

This heat must be conveyed away in a suitable manner. In an NMR tomography apparatus for solid-state examinations, a good cooling of the gradient coils is particularly necessary, because the patient lies in the interior space of the gradient coil assembly, which is constructed in a tubular shape. Excessive heating of this assembly would be uncomfortable for the patient and would compromise the willingness of patients to undergo NMR tomographic examinations.

German Patentschrift 41 41 514 teaches a gradient coil assembly of the above type. Ventilation channels serve as cooling means, these channels being formed in the assembly by U-shaped profiles through the interior space.

In this gradient coil assembly, however, the incorporation of the channels for the cooling medium into the assembly is costly, and the heat conveyance is not optimal.

German OS 34 04 457 teaches an arrangement for cooling a magnet system, this arrangement being provided particularly for attachment to a basic field coil of an NMR tomography apparatus. The cooling includes a number of cooling elements with a heat conductor plate in the form of a ring wheel, this plate being provided with a number of radial slots distributed uniformly around the circumference of the plate. A cooling agent conduit is soldered or welded onto the heat conduit plate or embedded or pressed or cemented into the heat conduit plate.

Such a cooling structure is only suitable for attachment to level surfaces which are to be cooled.

German OS 40 17 260 discloses a method for the production of a gradient coil arrangement of an MRI apparatus.

SUMMARY OF THE INVENTION

It is an object of the present invention to provide an adequately cooled gradient coil assembly which can accommodate non-planar gradient coils and in which a capable cooling structure is contained with a relatively low outlay.

The above object is achieved in accordance with the principles of the present invention in a gradient coil assembly for an NMR tomography apparatus including at least one gradient coil and at least one cooling structure, the cooling structure including at least one flexible cooling conduit for conducting a cooling medium, this conduit being flexibly attached to a flexible carrier. The gradient coil is also connected to the flexible carrier.

The invention has its basis in the provision of a flexible carrier for at least one cooling conduit which is also flexible. In an optimal arrangement, the cooling conduit can be comfortably assembled on the carrier, and thereafter, one or more complete cooling structures are combined into the gradient coil assembly, together with one or more gradient coils. The inventive gradient coil assembly thus can be prepared in a cost effective manner without having to sacrifice good cooling properties. Moreover, the carrier forms an additional electrical insulator.

The connection points between the cooling conduit and the carrier are also inventively flexible. The flexibility of the cooling structure is particularly good by means of this measure, because relative motion between the conduit and the carrier is made possible. Additionally, a cooling conduit flexibly attached to the carrier can be modified as to its position for fine adjustment.

A flexible cooling structure either can be attached to a flat gradient coil or to a non-planar gradient coil, with the cooling structure preferably being fitted to the shape of the gradient coil in order to enable a good thermal contact. The gradient coil can be curved in one direction (e.g. cylindrically or in the shape of an envelope of a cone) or in a number of directions.

In order to obtain a good cooling effect, a liquid coolant preferably serves as a cooling medium, for example water, oil, or a water/oil mixture.

The cooling structure is preferably constructed initially in a flat state. This is particularly comfortable and permits the utilization of a winding form for the cooling conduit. The carrier also can be prestressed to the approximate later shape of the curve during the attachment of the cooling conduit.

The flexible connection between the cooling conduit and the carrier preferably ensues by a seam which is sewn with an elastic thread or with some play between the thread loops and the cooling conduit, for example. Alternatively the cooling conduit can be glued onto the carrier by an elastic glue in a puncti-form fashion. A relatively rigid connection between carrier and cooling conduit can also be used if this connection is limited to those points which shift only a small amount, if any, when the cooling structure is fitted to the shape of the gradient coil.

In a preferred embodiment, the cooling conduit consists of a plastic pipe, of polyamide (PA) or polyethylene (PE), for example. In principle, a conduit of sufficiently soft metal, for example copper, could also be used. Such a conduit would in fact have a lower heat transmission resistance; however, due to eddy currents, problems would result due to the need for electrical insulation and with regard to its ductility.

The cooling conduit is preferably constructed as one piece, i.e. free of separation points (joints). Thus, there are no connection pieces (for example angle pieces or U-pieces) provided in the cooling conduit. Such a cooling conduit is reliably tight over a long lifetime. Moreover, problems associated with narrow curve radii of connection pieces are avoided.

The cooling conduit is preferably conducted in a bifilar fashion; that is, in the form of an extended loop whose point of reversal is arranged approximately in the center of the conduit length and whose two legs proceed next to each other with opposing flow directions. Thus the temperature gradient is balanced over the length of the conduit, and a more uniform cooling effect is achieved. Moreover, in a bifilar arrangement, the advance and return of the cooling conduit lie approximately adjacent, so that the outlay for the outer tubing is low.

The cooling conduit can be conducted in a spiral or a serpentine shape. The cooling conduit path preferably fits the spatial distribution of the cooling demand. The wall thickness of the cooling conduit is preferably appropriately selected dependent on the desired heat transition value, the pressure of the cooling medium, and the desired electrical insulation properties.

Thee cooling structure preferably includes a number of cooling rings which can be connected in parallel. The pressure loss is thus kept down, the rate of flow amount is increased, and redundant paths are made available. The cooling rings can each have separate coolant terminals. Then individual cooling rings can be switched into and out of the cooling "circuit" according to the momentary cooling demand.

The carrier is preferably formed from a non-magnetic plastic or composite material, for example, from a laminated plastic plate, a glass-fiber reinforced plate, or a suitable plastic plate. The carrier only needs to be flexible enough so that it can be brought into the described shape. The thickness of the carrier is selected dependent on the desired heat transition value and the electrical insulation properties.

Securing elements or assembly elements for at least one other structural element are preferably constructed or attached at the carrier. This other structural element can be another gradient coil which is secured to the side of the carrier opposite the cooling conduit.

In a preferred embodiment the gradient coil(s) and the cooling structure are cast with a suitable casting compound, for example, with a filled epoxy resin, in order to form the gradient coil assembly. If the casting compound is hardened at higher temperatures (e.g. 120° C.), the structural elements of the cooling structure must be produced from sufficiently temperature-resistant materials. A substantially rigid assembly is created by the casting. In this case, the flexibility of the carrier and of the cooling conduit simplifies the production of the gradient coil assembly and moreover leads to a lower mechanical load in operation, because different heat capacities of the individual structural elements are balanced.

In a gradient coil assembly with a number of gradient coils, a number of cooling structures is preferably provided, possibly alternating in different layers with the gradient coils.

A winding form is preferably used in the inventive production method, in order to give the cooling conduit a course which is matched to the cooling requirements.

The production of the gradient coil assembly is particularly cost-effective if a gradient coil is first made available on a winding spindle, then the cooling structure is attached to this gradient coil, with another gradient coil then (if desired) being attached at assembly elements of the cooling structure, and all the aforementioned structural elements are cast at once, and finally, the winding spindle is withdrawn from the thusly formed gradient coil assembly.

DESCRIPTION OF THE DRAWINGS

FIG. 2 is a section along the line II—II in FIG. 1.

DESCRIPTION OF THE PREFERRED EMBODIMENTS

Figure 1:
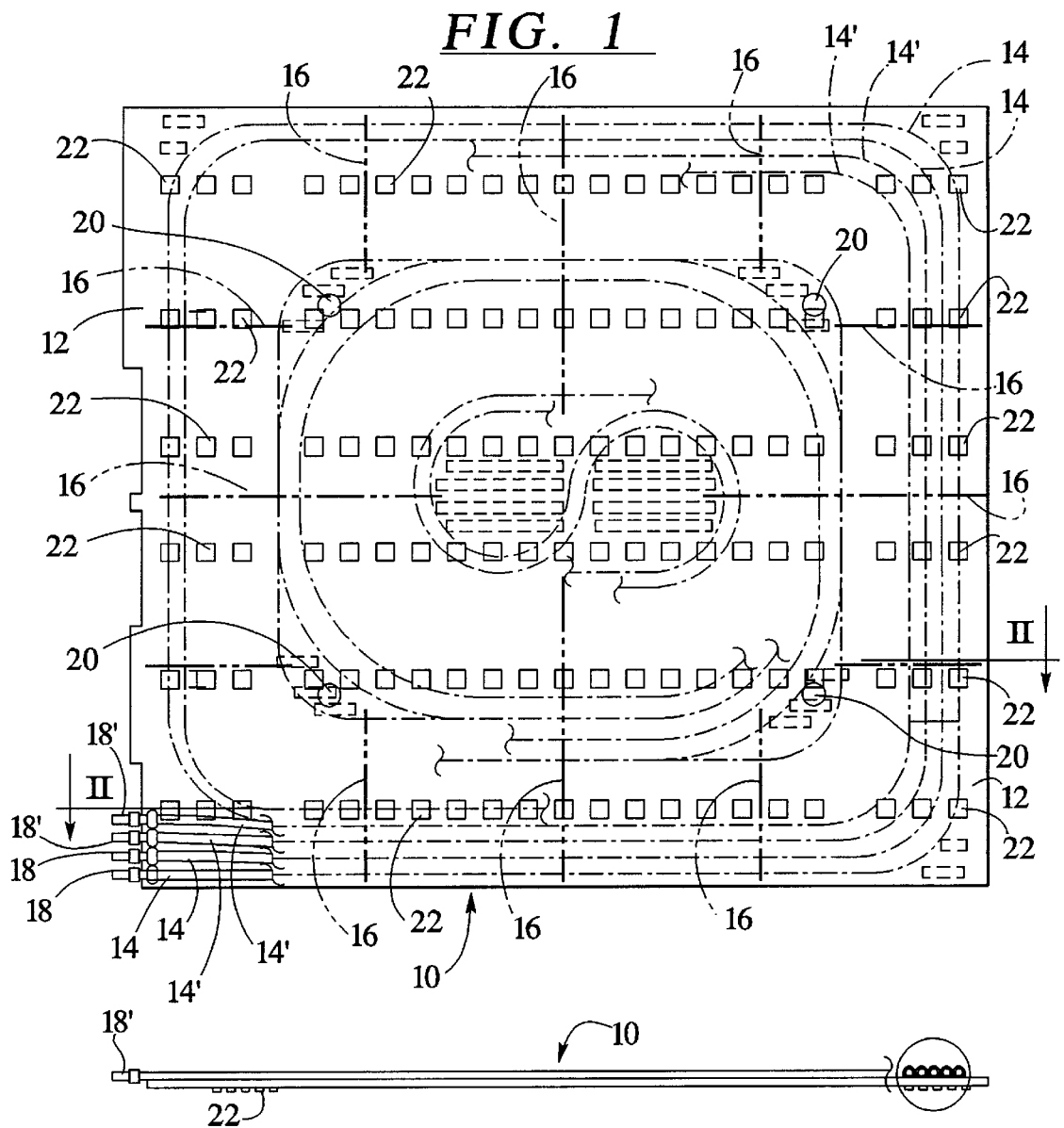
FIG. 1 is a plain view of a cooling structure constructed in accordance with the invention.
Figure 3:
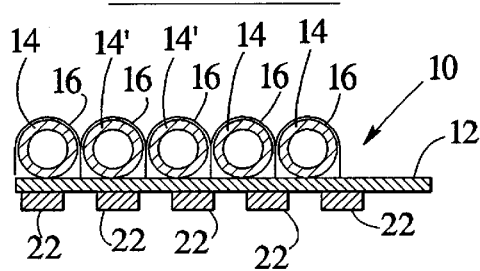
FIG. 3 is an enlarged sectional illustration of the region designated with a circle in FIG. 2.

The cooling structure 10 depicted in FIGS. 1 to 3 includes a flexible carrier 12 constructed as a somewhat quadratic, flat plastic plate. Two cooling conduits 14, 14' are arranged in a spiral shape on one side of the carrier 12, these conduits being connected to the carrier 12 by flexible seams 16.

The two cooling conduits 14, 14' are constructed as flexible plastic conduits of polyamide (PA). They are arranged in a bifilar fashion, i.e. as oblong loops, wherein the two legs of such a loop are arranged adjacently with opposing flow directions of a cooling medium therein, respectively. The center of each cooling conduit 14, 14'—i.e. the reversal point—is arranged in the middle of the carrier 12 in the shape of an "S". The cooling conduits 14, 14' are formed as one piece and thus free of separation and connection points.

The cooling conduit 14 has two terminals 18 which serve as inlet and return terminals and are adjacently arranged at the edge of the carrier 12. The cooling conduit 14' is correspondingly provided with two terminals 18'. The cooling conduits 14, 14' can be connected to a cooling system of the NMR tomography apparatus via the terminals 18, 18', this cooling system pumping the cooling medium, e.g. water, through the cooling conduits 14, 14'.

In the exemplary embodiment described herein, the cooling conduits 14, 14' cover the carrier 12 approximately uniformly over its entire surface. There are gaps only in the middle of the carrier 12 (near the reversal points of the cooling conduits 14, 14', which points require a certain amount of space due to the limited bending radius of the cooling conduits 14, 14') and at four securing holes 20. This exemplary embodiment of the cooling structure 10 thus is suitable for applications in which the heat to be conveyed away is removed approximately uniformly. In alternative embodiments, the conduit format can have tighter and less tight regions in order to fit the cooling effect to various heat output zones.

The seams 16 are attached at the carrier 12 parallel to its side edges, in order to hold the cooling conduits 14, 14' on the carrier 12 in a flexible manner. A few of the seams 16 are led from the middle of the side edges of the carrier 12 to the midpoint of the carrier 12, while other seams 16 are arranged only in one edge region of the carrier 12. Each seam loop surrounds a cooling conduit 14, 14' in a loose fashion and runs through the carrier 12.

At the side of the carrier 12 facing away from the cooling conduits 14, 14' assembly elements 22 are glued on, at which a further gradient coil can be attached, for example.

Figure 4:
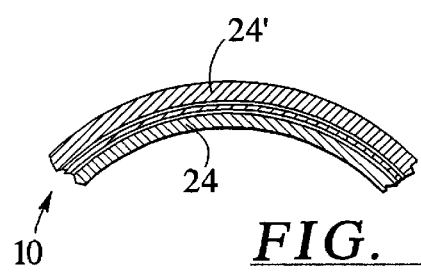
FIG. 4 is a sectional illustration of a region of a tubular gradient coil assembly constructed in accordance with the invention.

In the exemplary embodiment of a gradient coil assembly shown in FIG. 4, two gradient coils 24, 24' designed in tubular fashion include a cooling structure 10 which is fitted in its shape to the curve of the gradient coils 24, 24'. The inner gradient coil 24 is constructed as a saddle coil in order to create a magnetic field gradient in the x-direction. A further inner gradient coil, which is arranged displaced 90° relative to the gradient coil 24 and which creates a magnetic field gradient in the y-direction, is not shown in FIG. 4. The outer gradient coil 24' has two ring-shaped windings and serves for creating a gradient in the z-direction.

In the arrangement according to FIG. 4, the cooling conduits 14, 14' face the inner gradient coil 24, while the outer gradient coil 24' is secured at the assembly elements 22. Adjustment pins are incorporated in the gradient coil 24 and run through the holes 20 of the carrier 12. The whole assembly is cast with a filled epoxy resin.

For the production of the assembly according to FIG. 4, a cylindrical winding spindle (mandrel) is first made available. The gradient coil 24 for the gradient in the x-direction, as well as the further inner gradient coil for the gradient in the y-direction, are arranged thereon. Appropriate adjustment pins are placed in the gradient coils.

A sufficient number of cooling structures 10 are simultaneously produced. For each cooling structure 10, two cooling conduits 14, 14' are laid in respective grooves of a winding form, so that the cooling conduits 14, 14' are held in the winding form in their later course. The winding form is now placed on the still flat carrier 12, and the cooling conduits 14, 14' are sewn to the carrier 12 in a flexible fashion through oblong holes in the winding form. Now the winding form can be removed.

As the next step, the flat, flexible cooling structure 10 is bent corresponding to the curve of the gradient coils already located on the winding spindle, and the cooling structure 10 is placed onto the adjustment pins with the pins extending through securing holes 20 therein, with the cooling conduits 14, 14' facing these gradient coils. When the entire outer surface of the inner gradient coils is covered by the cooling structure 10, the gradient coil 24' is secured at the assembly elements 22. The whole assembly, still located on the winding spindle, is cast in a suitable form with a filled epoxy resin. Following the hardening of the resin at approximately 120° C., the winding spindle is withdrawn from the finished gradient coil assembly.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A gradient coil assembly for use in an NMR tomography apparatus, comprising:

a gradient coil;

a flexible cooling conduit for containing a flowing coolant for conveying heat away from said gradient coil during operation of said gradient coil;

a flexible carrier;

means for flexibly connecting said cooling conduit to said flexible carrier; and means for connecting said flexible carrier to said gradient coil.

2. A gradient coil assembly as claimed in claim 1 wherein said means for flexibly connecting said flexible cooling conduit to said flexible carrier comprises a flexible sewn seam.

3. A gradient coil assembly as claimed in claim 1 wherein said means for flexibly connecting said flexible cooling conduit to said flexible carrier comprises a flexible glue.

4. A gradient coil assembly as claimed in claim 1 wherein said flexible cooling conduit comprises a plastic pipe.

5. A gradient coil assembly as claimed in claim 4 wherein said plastic pipe comprises a continuous pipe free of joints.

6. A gradient coil assembly as claimed in claim 1 wherein said flexible cooling conduit is disposed on said flexible carrier in bifilar fashion.

7. A gradient coil assembly as claimed in claim 1 wherein said carrier comprises a non-magnetic material selected from the group consisting of non-magnetic plastic and non-magnetic composite materials.

8. A gradient coil assembly as claimed in claim 1 further comprising at least one assembly element attached to said carrier for holding a further structural element to said carrier.

9. A gradient coil assembly as claimed in claim 1 further comprising a casting compound covering said gradient coil, said flexible carrier and said flexible cooling conduit.

10. A gradient coil assembly as claimed in claim 9 wherein said casting compound comprises a filled epoxy resin.

11. A gradient coil assembly as claimed in claim 1 wherein said gradient coil is curved in at least one direction, and wherein said flexible cooling conduit is matched to a curve of said gradient coil.

12. A method for producing a gradient coil assembly for an NMR tomography apparatus, comprising the steps of:

providing a gradient coil;

providing a flexible cooling conduit for conveying a flowing cooling medium;

providing a flexible carrier;

flexibly attaching said cooling conduit to said flexible carrier to produce a cooling conduit/carrier combination; and attaching said cooling conduit/carrier combination to said gradient coil.

13. A method as claimed in claim 12 wherein said gradient coil has a non-planar shape, and wherein the step of providing said flexible cooling conduit comprises providing said flexible cooling conduit initially in a flat state and subsequently fitting said flexible cooling conduit to said non-planar shape of said gradient coil.

14. A method as claimed in claim 12 comprising the additional step of placing said cooling conduit in a winding form; and attaching said cooling conduit in said winding form to said flexible carrier.

15. A method as claimed in claim 12 comprising the additional step of providing a holder for at least one other structural element on said flexible carrier.

16. A method as claimed in claim 12 comprising the additional step of making said gradient coil available on a winding spindle;

attaching said flexible conduit to said gradient coil while said gradient coil is on said winding spindle;

casting at least said gradient coil and said flexible conduit in a casting resin simultaneously; and removing said winding spindle.

* * * * *